United States Patent [19]

Levijoki

[11] 4,130,722
[45] Dec. 19, 1978

[54] THICK-FILM CIRCUIT MODULE INCLUDING A MONOLITHIC CERAMIC CROSS-OVER DEVICE

[75] Inventor: David H. Levijoki, Milwaukee, Wis.

[73] Assignee: Globe-Union Inc., Milwaukee, Wis.

[21] Appl. No.: 758,075

[22] Filed: Jan. 10, 1977

[51] Int. Cl.² .............................................. H05K 1/00
[52] U.S. Cl. .............................. 174/68.5; 174/117 FF
[58] Field of Search .................... 174/68.5, 117 FF; 338/332, 314, 309, 327; 336/232

[56] References Cited

U.S. PATENT DOCUMENTS

| | | | |
|---|---|---|---|
| 222,768 | 12/1879 | Arbogast | 174/117 F |
| 3,497,859 | 2/1970 | Bang | 338/309 |
| 3,560,256 | 10/1966 | Abrams | 174/68.5 |
| 3,810,068 | 5/1974 | DeLuca | 338/327 |
| 3,812,442 | 2/1972 | Muckleroy | 336/232 |
| 3,982,218 | 9/1976 | Adler | 338/309 |

Primary Examiner—J. V. Truhe
Assistant Examiner—John H. Bouchard

Attorney, Agent, or Firm—John Phillip Ryan; David B. Smith

[57] ABSTRACT

A thick-film circuit module including a monolithic ceramic cross-over device, wherein the thick-film circuit includes a first conductive path and a second conductive path, transverse to the first conductive path and having spaced apart ends, and wherein the monolithic ceramic cross-over device is used in the second electrically conductive path as an electrically conductive device and for providing an insulative barrier between the first and second electrically conductive paths. The monolithic cross-over device comprises a ceramic chip including a plurality of stacked generally planar layers of ceramic material and electrically conductive metalized paths sandwiched between the respective layers of ceramic material, the ceramic chip having each of its opposite ends supporting an electrically conductive termination end cap, and the opposite ends of each of the electrically conductive metalized paths being connected to the respective termination end caps.

9 Claims, 3 Drawing Figures

U.S. Patent  Dec. 19, 1978  4,130,722
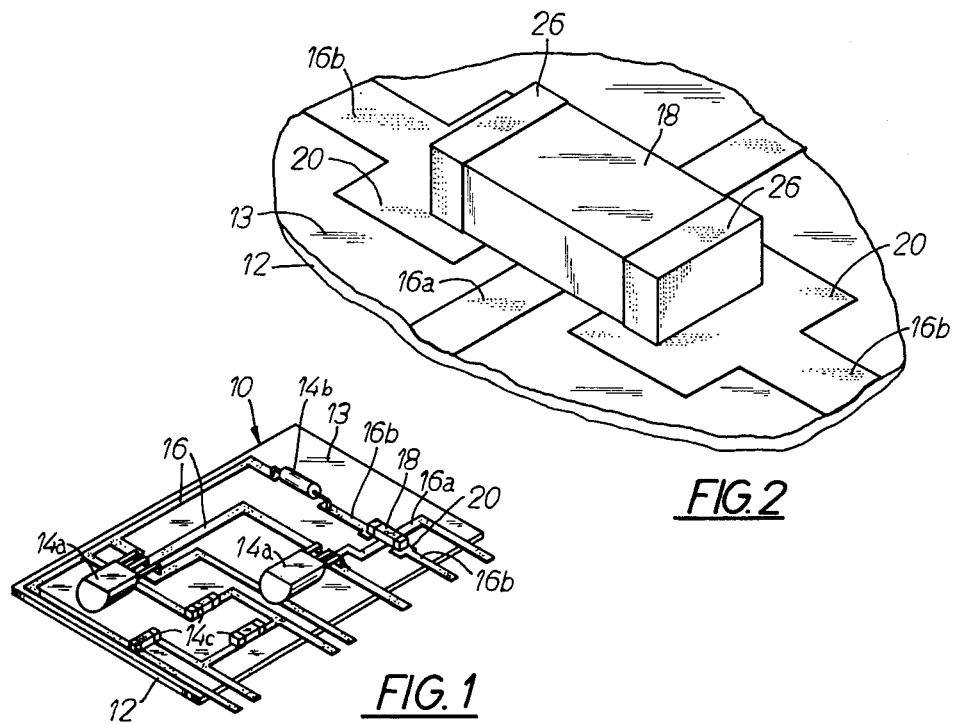
FIG.2
FIG.1
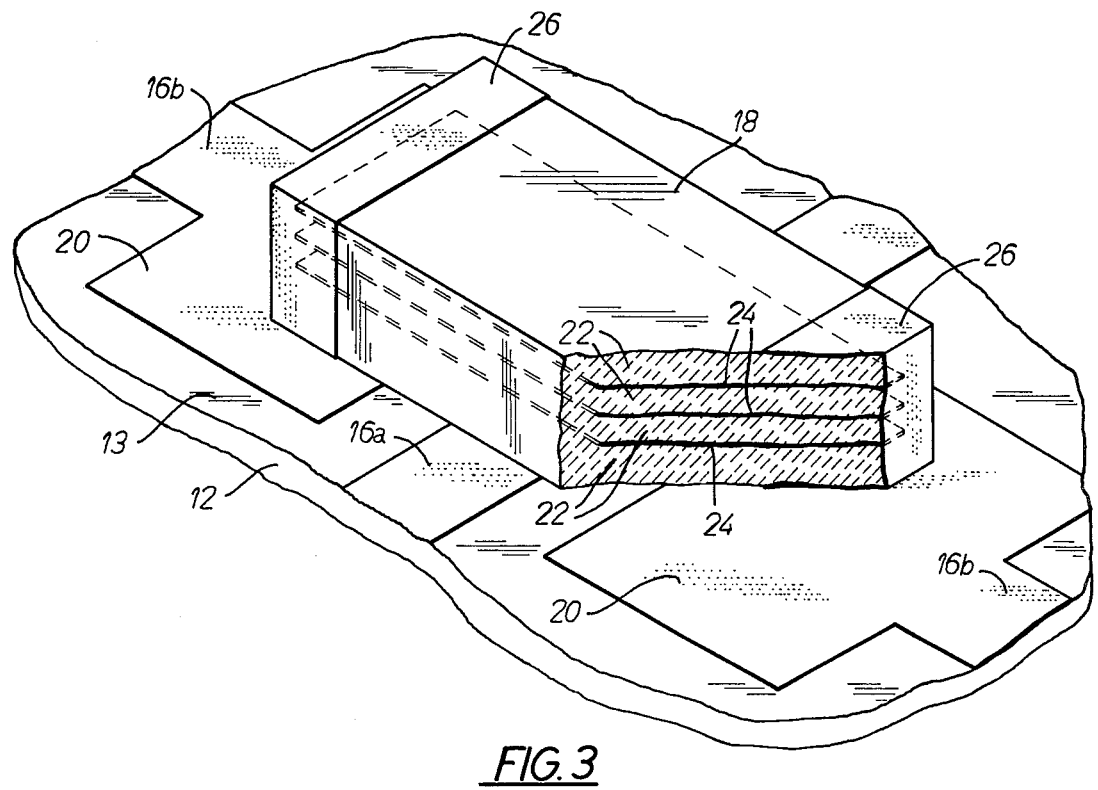
FIG.3

THICK-FILM CIRCUIT MODULE INCLUDING A MONOLITHIC CERAMIC CROSS-OVER DEVICE

BACKGROUND OF THE INVENTION

1. Field of the Invention

The present invention relates to microcircuit modules or packaged thick-film electronic circuits such as ceramic hybrid circuits and the like. More specifically, the present invention relates to improved means to facilitate manufacture of thick-film circuit modules having conductive metalized paths supported by a ceramic substrate and wherein at least two of the conductive paths cross one another.

2. Description of the Prior Art

A packaged thick-film electronic circuit or microcircuit is usually formed by applying a material such as silver conductive paint, or other precious metal or electrically conductive material, by means of a silk-screening process, to a supporting surface of a small plate of dielectric ceramic substrate material. The substrate and silver conductive paint thereon are then fired to produce a ceramic plate supporting metalized electrically conductive paths. Various necessary discrete components such as transistors, capacitors, diodes and the like can then be applied to the surface of the substrate and integrally connected with the metalized electrically conductive path to form a desired circuit thereon.

During the manufacture of such circuits, it is sometimes necessary that at least two of the electrically conductive paths cross one another. To avoid shorting between these two electrically conductive paths, it is necessary to provide an insulative barrier between them to facilitate bridging of one electrically conductive path over the other.

The prior art methods of fabricating a mircrocircuit having intersecting electrically conductive paths generally required the following steps. The screened on electrically conductive material is applied in such a manner that one of the conductive paths is interrupted so as to have spaced apart free ends on opposite sides of the other conductive path. After firing of the ceramic substrate and conductive paint to form the metalized paths on the substrate, it is then necessary to perform a second screening process to apply an insulating epoxy layer or other dielectric material to cover the uninterrupted conductive path to provide an insulative layer of material over that path and to support an electrically conductive connection between the free ends of the interrupted electrically conductive path. The bridge of conductive material is generally formed by either a second screening process where an electrically conductive paint is applied over the epoxy layer to join the free ends of the conductive path or by soldering a very short wire or metal ribbon at its opposite ends to the free ends of the interrupted electrically conductive path.

It can be readily appreciated that the additional steps of applying an insulative epoxy layer or the like over the conductive path and then the subsequent step of either screening another conductive path over the epoxy or soldering a short wire or ribbon into place, is both time consuming and costly. The cost problem is particulary acute because the microcircuit modules generally present an extremely small work subject and soldering a wire between two points on the circuit requires extreme accuracy.

SUMMARY OF THE INVENTION

The present invention provides a thick-film circuit module having an improved means to bridge or crossover conductive metalized or screened on paths which facilitates substantial cost savings during manufacture of the thick-film circuit modules. The invention includes the use of a monolithic ceramic cross-over chip which is receivable between the free ends of the interrupted conductive path to provide an electrically conductive bridge therebetween and to provide a ceramic layer between the uninterrupted conductive path and the conductive bridge thereby providing the requisite insulation and avoiding the need for the successive manufacturing steps of first applying an insulating layer in a discreet operation over the uninterrupted path and then a second step of soldering a conductive bridge between the free ends of the interrupted metalized path or screening an electrically conductive paint over the insulating layer to provide a bridge between the two ends of the interrupted path.

The monolithic ceramic cross-over chip is generally comprised of a plurality of layers of ceramic material having a metalized conductive electrode path sandwiched between each layer of ceramic material and including spaced apart conductive terminal end caps at opposite ends of the chip. Each metalized conductive path in the cross-over chip extends longitudinally through the chip and is connected at its opposite ends to the terminal end caps. The monolithic ceramic chip can be received on the hybrid circuit such that the termination end caps are respectively received against the free ends of the interrupted conductive path and the ceramic layers of the chip are received over the conductive path, whereby the metalized conductive paths in the cross-over chip provide an electrically conductive bridge between the ends of the interrupted path and the ceramic of the cross-over chip surrounding the metalized conductive path provides an insulative barrier to overlay the continuous path.

A distinct advantage of such monolithic ceramic cross-over chips is that they can be constructed so as to have a size and geometry equal to that of monolithic ceramic capacitor chips commonly used in thick-film circuits and generally positioned upon the ceramic substrate of the thick-film circuit by automated apparatus. Since the cross-over chips can have a size and shape equal to such monolithic chip capacitors, the same apparatus presently used to place the monolithic capacitors on the substrate can also be used to position the monolithic cross-over chips on the substrate.

Another advantage of the invention is that the cross-over device need not be specifically positioned or oriented on the substrate. For example, if it is placed upside-down, on its side, or in reverse orientation it will function equally well.

A further advantage of the use of monolithic cross-over chips is that they eliminate a number of manufacturing steps since the single step of positioning the cross-over chip on the substrate avoids the steps of applying a layer of insulating material over the metalized paths and firing the insulating material as well as the steps of either screening a conductive paint over the insulating layer and firing that layer of conductive paint or the manual steps of measuring, cutting, and soldering a very short conductive wire or ribbon over the insulating layer to thereby bridge the lower conductive path.

The cross-over chips are also particularly advantageous when discrete components are being applied to the substrate since they can be positioned on the substrate at the same time as the discrete components are positioned on the substrate and they can be soldered in place simultaneously and in the same manner as the discrete components. Consequently, no additional manufacturing steps are required to add the cross-over devices to the circuit module.

BRIEF DESCRIPTION OF THE DRAWINGS

FIG. 1 is an enlarged perspective view of a thick-film circuit embodying a monolithic ceramic cross-over device;

FIG. 2 is an enlarged partial perspective view of the thick-film circuit and cross-over device shown in FIG. 1; and FIG. 3 is an enlarged perspective view of the cross-over device shown in FIG. 2 and having portions broken away in the interest of clarity.

DESCRIPTION OF THE PREFERRED EMBODIMENT

A thick-film circuit 10 is shown in FIG. 1 as being comprised of a thin ceramic plate or substrate 12 having a planar upper surface 13 supporting a plurality of a discrete electronic components comprised of transistors 14a, diode 14b, and monolithic ceramic chip capacitors 14c. The substrate 12 is also shown as supporting electrically conductive metalized paths 16. As shown in FIG. 1, the circuit defined by the discrete components 14a-14c and the metalized paths 16 requires that at least two of the conductive metalized paths, 16a and 16b, cross each other. In order to prevent shorting between paths 16a and 16b at the point of cross-over, a monolithic cross-over device 18 is used in the interrupted conductive metalized path 16b to provide an electrical connection between the free ends of the interrupted metalized conductive path 16b and to provide an electrically insulative barrier between the two current paths.

The substrate 12 of the thick-film circuit 10 is of the type comprised of any of a variety of insulating materials, for example, a fired ceramic composed of alumina, having a thickness of the order of 25 mils, though the thickness of the substrate can vary, and the size of the substrate is dependent on the complexity of the circuit which, for example, it is intended to support. The substrate 12 can also be comprised of phenolic, fiberglass or epoxy materials. The thick-film circuit 10 is commonly produced by applying a metal conductive paint, comprised of conductive metal particles suspended in an organic vehicle, to the surface 13 of a ceramic substrate 12 in the configuration of the desired circuit using a silk-screen process or the like. A wide variety of metal conductive paints can be used, having silver, gold, palladium, platinum or base metals as the conductive materials therein. After the metal conductive paint has been screened onto the surface 13 of the substrate 12, the substrate 12 and the conductive paint are then placed in an oven and fired so that the silver or other conductive metal bonds with the surface 13 of the substrate 12 to form the metalized conductive paths 16. As shown in FIG. 2, when the conductive paint used to form the metalized conductive paths 16, is applied to the substrate, relatively broad metalized pads 20 can be formed at the free ends of the metalized conductive path 16b for supporting opposite ends of the monolithic ceramic cross-over chip 18.

The monolithic ceramic chip 18 has an elongated, generally rectangular shape, and includes a plurality of layers 22 of ceramic dielectric insulating material with electrically conductive electrode paths 24 between each of the layers 22. As shown in FIG. 3, the elongated electrode paths 24 each extend longitudinally the entire length of the ceramic chip so that the opposite ends of each of the layers of electrode material are exposed at the ends of the ceramic chip 18. Except for the free ends, however, the electrode paths 24 are each completely surrounded by dielectric ceramic material of the layers 22. The electrically conductive electrode paths 24 are each connected at each of their ends to terminal end caps 26 comprising a metalized coating of electrically conductive metal surrounding each of the opposite ends of the ceramic chip 18. The terminal end caps 26 function to provide mutual electrical connection between each of the stacked electrode paths 24 and also to provide an electrical connection between the electrode paths 24 and the pads 20 when the monolithic ceramic chip 18 is disposed with its opposite ends supported by the metalized pads 20.

The monolithic ceramic cross-over chip 18 can be produced in a manner similar to that commonly used to produce monolithic chip capacitors of the type used on thick-film circuits and having layers of dielectric ceramic separating electrode layers. See U.S. Pat. No. 3,920,781, issued Nov. 18, 1975 to Eror et al.; U.S. Pat. No. 3,534,238, issued Oct. 13, 1970 to Bueheler; U.S. Pat. No. 3,549,415, issued Dec. 22, 1970 to Capek et al.; and U.S. Pat. No. 3,041,189, issued June 26, 1962 to Herbert. The ceramic cross-over chips 18 are produced by casting a ceramic slurry, containing a ceramic such as barium titanate, to form a thin sheet of "green" ceramic on the order of 1.2 mils to 3.0 mils in thickness. Electrode materials consisting of particles of electrically conductive metal dispersed in an organic vehicle are screened onto the "green" ceramic sheets to form narrow paths of electrode on the sheets. The electrically conductive metal used as the electrode material can be silver, gold, nickel alloy or a number of other precious or base metals. The appropriate number of thin ceramic sheets having the screened electrode paths thereon are placed in a stacking and pressing die with the electrode paths on successive layers in stacked vertical alignment. The number of layers of electrode paths to be used is dependent on the current to be carried by the ceramic chip. The stacked layers are subjected to pressure to form laminated bars, and the laminated bars are cut into individual chips, the laminated bars being cut in such a manner that each electrode path in the chip is exposed at the opposite ends of the chip but otherwise surrounded by ceramic material. The chips are then fired to produce a monolithic ceramic chip having generally planar stacked layers 22 of ceramic material with successive generally planar layers 24 of electrode conductive paths therein. The opposite ends of the ceramic chip 18 are then dipped in a molten metal such as a nickel alloy or other conductive metal whereby the termination end caps 26 are formed on the end of the chip thereby providing an electrical connection between each layer of electrode material at each end of the chip. The metals which are used to form the termination end cap, though described as nickel alloy, could be one of a plurality of other electrically conductive metals such as silver. Unlike monolithic ceramic capacitors, the electrodes 24 in the cross-over chips each extend the full length of the chip and are connected at each of their opposite ends to the electrically conductive terminal end caps 26 such that a circuit is provided by each of the electrodes between the terminal end caps 26.

The method of producing a monolithic ceramic cross-over device described above comprises only one example of the possible alternative processes which can be used to manufacture the cross-over chips and should not be viewed as a limitation of the invention. For example, though FIG. 3 illustrates only three layers 24, the number of layer of ceramic and electrode conductive paths could be 35 or more and can be varied depending on the current density, power dissipation, size requirements, reliability requirements and cost objectives.

During manufacture of the thick-film circuit 10, using the monolithic ceramic cross-over chip 18, the chip 18 can be positioned and secured to the substrate 12 in the same manner and simultaneously with the application of the discrete components 14a–14c. The discrete components are generally applied to the substrate and to the metalized paths in one of two ways. Using one method, solder is applied directly to the metalized paths 16 at the desired points; the discrete components are positioned as desired; and then the substrate 12 is subjected to heat sufficient to cause the solder to flow. The substrate is then cooled whereby the components 14 become soldered to the substrate. Another method of attaching the components 14a–14c to the ceramic substrate includes the steps of applying an adhesive, such as epoxy, to the metalized paths at the desired points to secure the discrete components 14 to the substrate 12. The adhesive is dried and the substrate 12 and components 14 are dipped in a solder pot, containing molten solder. The solder, adhering to each of the metalized parts, will provide an electrically conductive connection between each of the discrete components 14 and the metalized electrical paths 16 on the substrate.

Using prior art methods and apparatus, in order to bridge a conductive path 16a, it was necessary to first apply an insulating layer of epoxy or the like over the conductive path being bridged and to then solder each of the opposite ends of a very small, short wire or metal ribbon in place to join the ends of the interrupted conductive path 16b. This process required the steps of screening the insulating layer onto the substrate, placing the substrate in an oven to dry the insulating layer and then soldering a conducting wire into place. Due to the very small size of the typical thick-film circuit, extra steps involved in soldering a cross-over wire into place were difficult to accomplish, time consuming and costly.

An advantage of the monolithic ceramic cross-over chips 18 is that they can be placed on the substrate 12 at the same time as the discrete components 14 are applied and soldered in place in the same manner. Therefore, it is unnecessary to perform the manufacturing steps of applying an insulating layer over the conductive path 16a or to perform the subsequent step of soldering a small conductive ribbon between pads 20. If the thick-film circuit incorporates the monolithic ceramic cross-over chip 18, either adhesive or solder can be applied to the pads 20 of the free ends of the conductive path 16b at the same time that adhesive or solder is applied to other portions of the substrate for attachment of discrete components. The monolithic ceramic cross-over chip 18 can then be placed on the substrate at the same time that the discrete components 14 are placed on the substrate. In the event adhesive is used to bond the components 14 and cross-over chips 18 to the substrate and the substrate is then dipped into a solder pot, the solder will adhere to the termination end caps 26 of the cross-over chip and provide an electrically conductive connection between the pads 20 of the electrically conductive path 16b and the termination end caps 26.

The discrete components 14 can be positioned on the substrate manually, however, it is commmon practice to use automated means to pick up and position each of the components on the substrate. Another advantage of the monolithic cross-over chips 18 is that they can be of the same size and geometric configuration as the monolithic chip capacitors 14c, generally used as one of the discrete components of the thick-film circuit. Consequently, the ceramic cross-over chips 18 can be placed upon the substrate 12 by existing automated apparatus presently used to position the monolithic chip capacitors 14c on the substrate 12.

A further advantage of the monolithic cross-over chips 18 is that their relative orientation on the substrate is unimportant as long as one of the terminal end caps 26 is in contact with one of the pads 20 and the other terminal end cap is in contact with the other pad. Since the middle portion of the cross-over chip is surrounded by ceramic material, the chip 18 can be positioned upside-down, on its side or reversed, yet provide an insulative layer between the conductive path 16a and the electrodes 24. Furthermore, since the terminal end caps 26 completely surround the respective ends of the chip 18, an electrical connection between the electrodes 24 and the pads 20 will be provided regardless of the orientation of the chip 18. Since the relative oritation of the chip 18 can be varied, automated equipment used to pick up and position the chip 18 on the substrate 12 can be much less complicated and expensive because the chips do not have to be individually aligned or otherwise positioned before they can be handled by the automated apparatus.

I claim:

1. A non-signal altering ceramic cross-over device for use in a film-type circuit comprising:
    a plurality of generally planar layers of ceramic dielectric material disposed in laminated stacked relationship, said layers having opposite ends and opposite edges;
    at least one generally thin planar non-signal altering electrically conductive path interposed between two of said layers of ceramic material, said conductive path having opposite ends and opposite edges, said opposite edges of the electrically conductive path being spatially positioned inwardly of the opposite edges of said layers of ceramic material, the layers of ceramic dielectric material and interposed conductive path forming a laterally surfaced dielectric monolithic structure;
    a first termination end cap of electrically conductive material supported on said monolithic structure and coating at least a portion of one of said opposite ends of each of said layers of ceramic material, and said first termination end cap being in electrically conductive communication with one of said opposite ends of said conductive path; and
    a second termination end cap of electrically conductive material supported on said monolithic structure and coating at least a portion of the other of said opposite ends of each of said layers of ceramic material and being in electrically conductive communication with the other of said opposite ends of said electrically conductive path.

2. The monolithic ceramic cross-over device set forth in claim 1 including at least two spaced apart generally parallel planar electrically conductive paths, said electrically conductive paths being separated by at least one of said layers of ceramic material, and said electrically conductive paths each having opposite ends, one of said opposite ends of each of said paths being electrically connected to said first terminal end cap and the other of said opposite ends of each of said paths being electrically connected to said second terminal end cap.

3. The monolithic ceramic cross-over device set forth in claim 1 wherein said plurality of generally planar layers of ceramic material form a generally rectangular prism ceramic chip having a plurality of planar surfaces.

4. The monolithic ceramic cross-over device set forth in claim 2 wherein said plurality of generally planar layers of ceramic material form a generally rectangular prism ceramic chip having a plurality of planar surfaces.

5. A film-type circuit module comprising:
an electrically insulating supporting substrate, said substrate having a supporting surface;
a first electrically conductive path supported by said supporting surface;
a second electrically conductive path supported by said supporting surface and transverse to the first conductive path, said second conductive path being interrupted and including spaced apart ends on opposite sides of said first conductive path, each of said spaced apart ends being spaced from said first conductive path; and
non-signal altering bridge means for providing electrical connection between said spaced apart ends, said bridge means including a ceramic chip having opposite ends and opposite edges and including at least a pair of generally planar layers of ceramic material, at least one generally planar layer of electrically conductive material having opposite ends and opposite edges, said opposite edges of the electrically conductive material being spatially interposed and positioned inwardly of the opposite edges of said ceramic material in stacked relation with and supported by said layers of ceramic material, said layers of ceramic material and interposed conductive material forming a laterally surfaced dielectric monolithic structure, and electrically conductive terminals at said opposite ends, said terminals each being connected to said layer of electrically conductive material, and one of said terminals being in electrically conductive communication with one of said spaced apart ends and the other of said terminals being in electrically conductive commmunication with the other of said spaced apart ends, and wherein said monolithic structure is disposed over said first electrically conductive path.

6. The film-type circuit module set forth in claim 5 wherein said monolithic ceramic chip includes a plurality of spaced apart, generally parallel electrically conductive layers, said electrically conductive layers being separated by at least one layer of ceramic dielectric material.

7. The film-type circuit module set forth in claim 5 wherein said ceramic chip has an elongated generally rectangular prism configuration and includes a plurality of planar surfaces, one of said planar surfaces being received against said supporting surface.

8. The film-type circuit module set forth in claim 5, wherein said film is a thick film.

9. The film-type circuit module set forth in claim 5, wherein said film is a thin film.

* * * * *